United States Patent
Ghantiwala

[19]

[11] Patent Number: 6,096,404
[45] Date of Patent: *Aug. 1, 2000

[54] FULL FACE MASK FOR CAPACITANCE-VOLTAGE MEASUREMENTS

[75] Inventor: Nayana Ghantiwala, San Jose, Calif.

[73] Assignee: Applied Materials, Inc., Santa Clara, Calif.

[*] Notice: This patent is subject to a terminal disclaimer.

[21] Appl. No.: 09/007,224

[22] Filed: Jan. 14, 1998

Related U.S. Application Data

[63] Continuation-in-part of application No. 08/985,644, Dec. 5, 1997, Pat. No. 6,030,513.

[51] Int. Cl.[7] ............................... C23C 14/34; B32B 3/24
[52] U.S. Cl. ........................ 428/138; 428/131; 428/134; 428/135; 428/136; 428/192; 118/505; 118/721; 204/298.11
[58] Field of Search ..................................... 428/131, 134, 428/135, 136, 192, 138; 118/505, 721; 204/298.11

[56] References Cited

U.S. PATENT DOCUMENTS

| | | | |
|---|---|---|---|
| 4,704,306 | 11/1987 | Nakamura | 427/100 |
| 4,830,723 | 5/1989 | Galvagni et al. | 204/192.17 |
| 4,988,424 | 1/1991 | Woodward et al. | 204/298.11 |
| 5,154,797 | 10/1992 | Blomquist et al. | 156/644 |
| 5,223,108 | 6/1993 | Hurwitt | 204/192.12 |
| 5,338,424 | 8/1994 | Drimer et al. | 204/298.11 |
| 5,393,398 | 2/1995 | Sugano | 204/298.11 |
| 5,863,396 | 1/1999 | Flanigan | 204/298.11 |

*Primary Examiner*—William P. Watkins, III
*Attorney, Agent, or Firm*—Thomason, Moser and Patterson

[57] ABSTRACT

A mask for covering a substrate for performing capacitance-voltage measurements on the substrate is a full-faced mask covering substantially all of the substrate and having a thin outer section and a thicker inner section, so that the outer section is thin enough to permit desired clearance tolerances when inserting the substrate/mask assembly into or removing it from a cassette, and the inner section is thick enough to provide structural stability to the mask to ensure proper contact between the mask and the test substrate. The mask may include a ring with one or more strips across the ring with holes in the strips for target material deposition. In an alternative embodiment, the mask may be a disk with holes at various locations across the disk. In either embodiment, the mask generally conforms to the shape of the substrate, so that the clamp ring of the PVD chamber seats on the mask or on the substrate, so little or none of the plasma or sputtered material can escape between the substrate and clamp ring. Various embodiments of the mask provide different ways to hold the mask on the substrate, such as clamping with clips, gluing with an adhesive, folding extensions of the mask over the edge of the substrate, and holding by surface tension.

12 Claims, 7 Drawing Sheets

FULL FACE MASK FOR CAPACITANCE-VOLTAGE MEASUREMENTS

This is a continuation-in-part application of U.S. patent application Ser. No. 08/985,644 filed Dec. 5, 1997 now U.S. Pat. No. 6,030,513.

BACKGROUND OF THE INVENTION

1. Field of the Invention

The present invention generally relates to systems for processing substrates. Specifically, the present invention relates to methods and apparatuses for performing capacitance-voltage measurements on a substrate processed in a processing system.

2. Background of the Related Art

Processing systems for processing 100 mm, 200 mm, 300 mm or other diameter substrates are generally known. Typically, such processing systems have a centralized transfer chamber mounted on a monolith platform. The transfer chamber is the center of activity for the movement of substrates being processed in the system. One or more process chambers mount on the transfer chamber for performing processes on the substrates. Access to the transfer chamber from the clean ambient environment is typically through one or more load lock chambers. A transfer chamber substrate handler is pivotably mounted in the middle of the transfer chamber and can access each of the process chambers and load lock chambers to transfer substrates therebetween. The load lock chambers may open to a very clean room, referred to as the white area, or to a substrate handling chamber, typically referred to as a mini-environment. A substrate handler in the optional mini-environment transfers substrates in a very clean environment at atmospheric pressure from pods, or cassettes or carriers, seated on pod loaders to the load lock chambers.

Several different types of process chambers, such as physical vapor deposition (PVD) chambers, chemical vapor deposition (CVD) chambers, etch chambers and others, may be attached to the transfer chamber for processing substrates. A PVD chamber, for example, deposits a metal film, such as aluminum or copper, onto the surface of the substrates to form conductive traces connecting various elements, such as transistors and capacitors, of a circuit being created on the substrate. Typically, an insulating layer, such as an oxide, is formed on the surface of the substrate to prevent the metal from contacting at improper locations and vias, or holes, are formed in the insulating layer to permit the metal to contact the proper locations. After the metal is deposited, typically, regions of the metal may be removed, such as by etching, to create individual traces connecting parts of the substrate. To do the deposition, the PVD chamber includes a target of the metal or a compound of the metal displaced opposite a substrate to provide the metal, which will be sputtered onto the substrate. The PVD chamber generates a plasma of a process gas, such as argon, between the target and the substrate. Ions in the plasma are accelerated toward the target to knock the target material loose, so the target material can deposit on the substrate.

A problem with the targets is that a poor quality of material will result in a poor quality of film deposited on the substrate. For example, if the target is contaminated with sodium, then the sodium will deposit onto the substrate surface along with the metal and migrate into the substrate material, thereby causing a short between the semiconductive material of the substrate and the deposited metal film. On the other hand, if the target material is of a good quality, then the metal film and semiconductive substrate will be properly insulated from each other by the oxide layer. In other words, the metal film and the semiconductive substrate will have an expected capacitance between them, with the oxide layer as a dielectric material.

Another problem is that a poor quality of the insulating oxide layer may cause the oxide to have unacceptable insulating capability. The oxide layer is typically formed in a finance, or other device, so if the furnace is not functioning properly, then the oxide layer may be contaminated or, otherwise, of low quality.

Since the metal film, oxide layer and semiconductive substrate form a capacitor, the quality of the target material or the oxide layer or the functioning of the furnace can be determined by a capacitance-voltage test, wherein the capacitance between the metal film and the semiconductive substrate is measured with respect to a voltage applied therebetween. Such a test is typically performed to qualify a target when the target is first placed in the PVD chamber prior to processing substrates or to re-qualify the target after the PVD chamber has been opened or to qualify the furnace. To perform the test, the target material is deposited onto the surface of an exemplary substrate, having the oxide layer at its surface, at a sufficient number of locations to provide reliable data. The target material is deposited at select locations by placing a mask, such as the mask 10 shown in FIG. 1a, onto the substrate 12, and depositing the target material onto the substrate 12 so that the mask prevents deposition except at the holes 16. A pattern of target material will be formed on the substrate 12 at the locations of the holes 16. Afterwards, capacitance-voltage measurements are made at each of the locations of the target material.

The mask 10 is held in place on the substrate 12 by clamps 14, so the substrate 12 can be inserted into the processing system and the PVD chamber, in the same manner as a substrate that is to be processed, without a risk that the mask 10 may slide or fall off of the substrate 12. The PVD chamber has a clamp ring 18 (FIG. 1b) that seats on the periphery of the substrate 12 during deposition of the target material to prevent the plasma of the process gas and the sputtered metal from the target material from leaking out beyond the substrate 12 and contaminating other surfaces of the substrate or depositing onto surfaces of the PVD chamber. A problem with using the mask 10 in a PVD chamber having the clamp ring 18 is that a gap 20 can form between the mask 10 and the clamp ring 18, thereby allowing the plasma and the sputtered material to escape into other parts of the PVD chamber.

A full face mask is one that covers the edge of the test substrate around the entire periphery of the test substrate and can reduce or eliminate the gaps between the clamp ring and the test substrate by providing a surface on which the clamp ring can rest throughout the periphery of the test substrate. However, a problem with a full face mask, that has heretofore made it impractical to use a full face mask, is that the thickness of the test substrate combined with the full face mask is such that the test substrate/mask assembly cannot properly fit into a cassette for delivery to the processing system. The cassettes used for delivering substrates to processing systems are defined by industry standards to have a certain number of teeth, typically about 13 or 25, for supporting the substrates and a certain space between the teeth to provide a needed clearance tolerance for substrates to be placed into and removed from the cassettes. The full face mask must be thick enough to have sufficient strength, but the ideal thickness of the full face mask makes the test substrate/mask assembly too large for adequate clearance tolerances in the space between the shelves of the cassettes. Thus, there is an unacceptable risk of collision between the test substrate/mask assembly and the teeth of the cassettes.

Therefore, a need exists for a mask for performing capacitance-voltage measurements whereby little or no plasma or sputtered material can escape from the region within which the deposition is being performed on the substrate.

SUMMARY OF THE INVENTION

A mask for covering a substrate for performing capacitance-voltage measurements on the substrate to determine the quality of a target material in a process chamber, such as a physical vapor deposition (PVD) chamber, is a full-faced mask covering substantially all of the substrate and having a thin outer section and a thicker inner section, so that the outer section is thin enough to permit desired clearance tolerances when inserting the substrate/mask assembly into or removing it from a cassette, and the inner section is thick enough to provide structural stability to the mask and to ensure contact between the mask and the test substrate. The mask may include a ring with one or more strips across the ring with holes in the strips for target material deposition. The spaces between the strips decrease the weight of the mask. In an alternative embodiment, the mask may be a disk with holes at various locations across the disk for permitting target material deposition at many desired locations on the substrate surface. In either embodiment, the mask generally conforms to the shape of the substrate, so that the clamp ring of the PVD chamber seats on the mask along the entire periphery of the substrate, so little or none of the plasma or sputtered material can escape between the mask and clamp ring. Thus, the substrate and mask perform like an ordinary substrate with a slightly greater thickness than normal. In still another embodiment, the mask is smaller than the diameter of the substrate and of the clamp ring, so that the clamp ring can seal the substrate as it would with a substrate that didn't have a mask.

In one embodiment, the mask is held in place on the substrate with a set of clips. The mask may have a slightly thinned region providing a gap between the mask and the substrate, so that the clips may extend from the outer edge of the substrate to the inner edge of the ring of the mask through the gap and connect the mask to the substrate without interfering with the seat between the clamp ring and the mask. In an alternative embodiment, the mask may be slightly wider than the substrate throughout the circumference of the substrate or at certain locations along the periphery of the mask, so that the edges of the mask may be bent over and crimped to the edge of the substrate to hold the mask on the substrate. In yet another alternative embodiment, the mask may have bent edges beyond the edge of the substrate whereby the mask is held in place horizontally, but without crimping to the substrate to hold the mask vertically. In still another embodiment, the mask may be glued or adhered to the substrate with a glue or adhesive placed at locations remote from the deposition holes, so that the holes are not clogged by the adhesive.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 2:
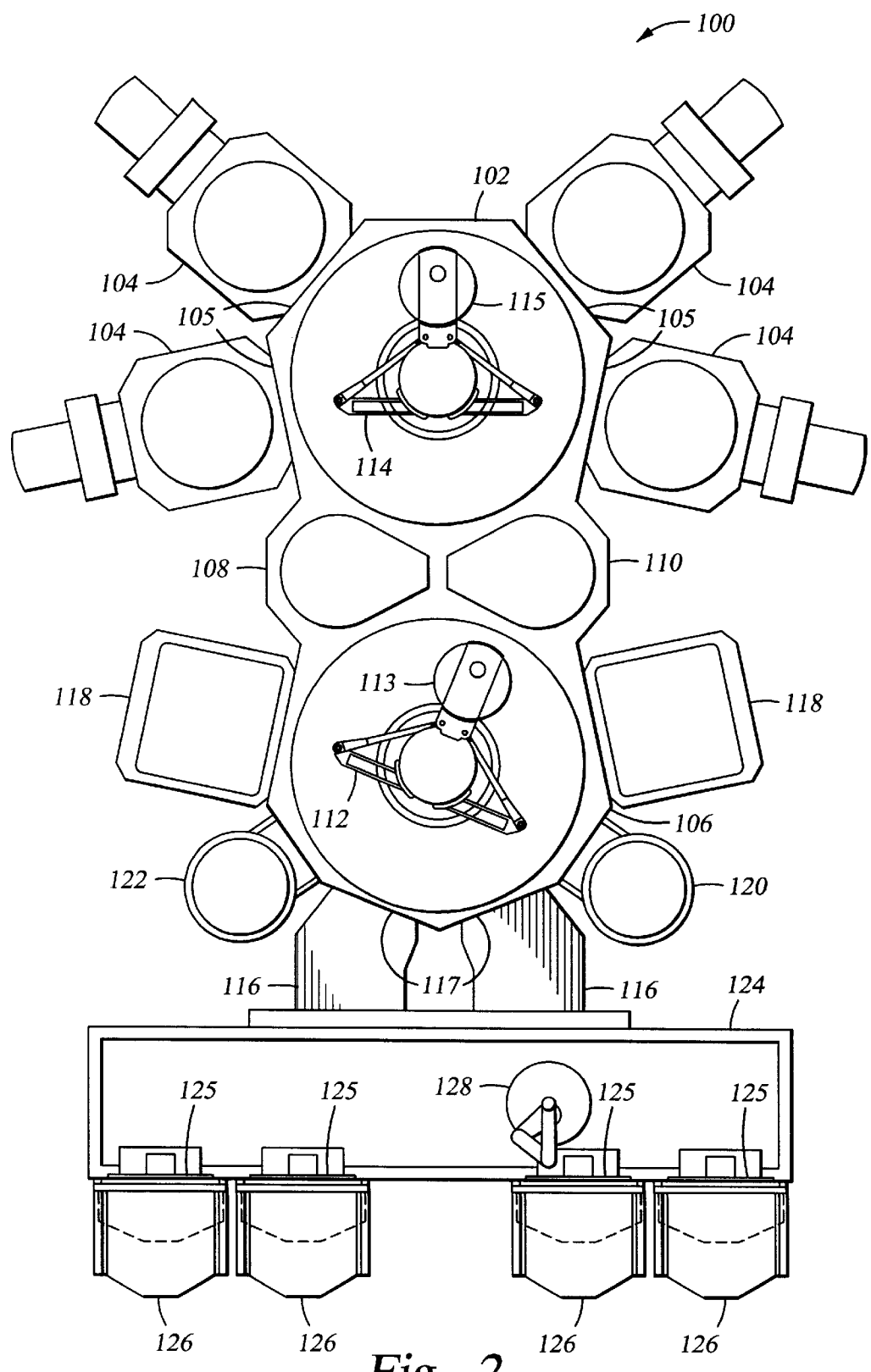
FIG. 2 is a top schematic view of a processing system.

FIG. 2 shows an embodiment of a vacuum processing system 100 of the present invention. The vacuum processing system 100 and its function will be described in detail below. Generally, the vacuum processing system 100 includes a transfer chamber 102, a buffer chamber 106, a pre-clean chamber 108, a cool-down chamber 110, one or more process chambers 104, one or more load lock chambers 116, one or more expansion chambers 118–122 and an optional substrate handling chamber 124, referred to herein as the mini-environment. The below-described masks will be shown with reference to their use in a physical vapor deposition (PVD) chamber, however, it is understood that the invention is not so limited, but may be practiced with any suitable type of process chamber 104. Thus, the process chambers 104 may be any type of chambers, such as physical vapor deposition (PVD) chambers, chemical vapor deposition (CVD) chambers or the like.

Figure 3:
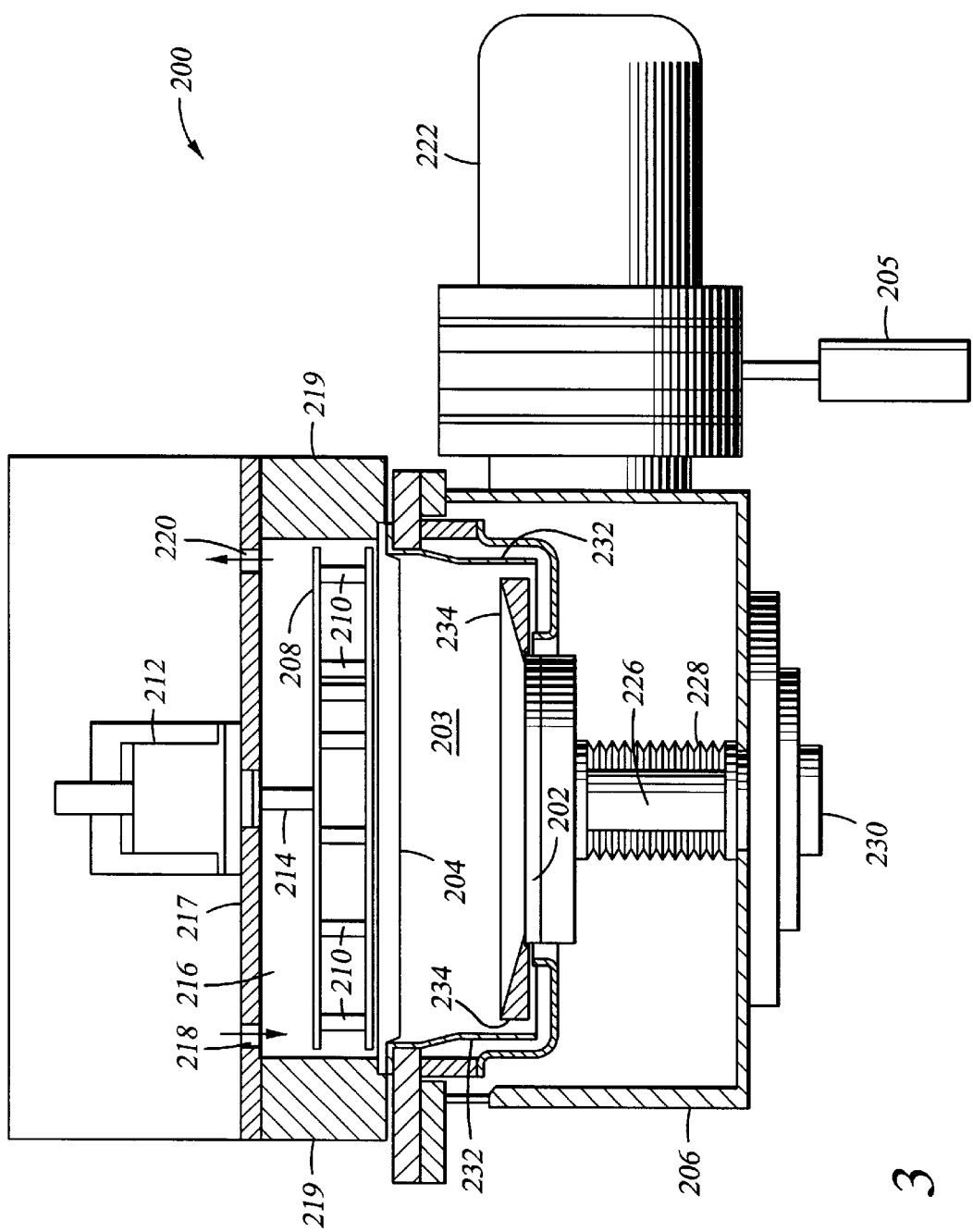
FIG. 3 is a side schematic view of a process chamber.

FIG. 3 shows a simplified example of a PVD chamber 200. The PVD chamber 200 generally includes a chamber section 206 and a pump section 222. The chamber section 206 generally includes a substrate support member 202 for supporting a substrate (not shown) to be processed, a target 204 for providing a material, such as aluminum, to be deposited on the substrate, a process environment 203 wherein a plasma of ions is generated to sputter the target 204 and a clamp ring 234 surrounding the substrate support member 202 to prevent the plasma or the target material from escaping from the process environment 203 and contaminating any other part of the PVD chamber 200. As stated briefly above, although the substrate support member 202 will be described with reference to a process chamber having the configuration of the PVD chamber 200, it is understood that the invention is not so limited. Rather, the process chamber may be any type of process chamber and may be configured with the substrate support member and process environment above or to the side of, as well as below, the target. Thus, any indications of up, down or other directions are only references and not meant to limit the invention.

The PVD chamber 200 generally includes the substrate support member 202, also known as a susceptor or heater, disposed within the chamber section 206 for receiving the substrate from a transfer chamber 102 (FIG. 2). A target 204 is disposed in the top of the chamber section 206 to provide material, such as aluminum, copper, titanium, tungsten or other deposition material, to be sputtered onto the substrate during processing by the PVD chamber 200. When a new target 204 is initially installed in a PVD chamber 200, the quality of the deposition material is determined by sending a test substrate through the process system 100 to receive a metal deposition layer on top of an oxide insulation layer. A mask (described below) is attached to the substrate to permit deposition of the material only in designated test locations. The test (described in more detail below) performed on the substrate determines the capacitance between the metal layer and the semiconductive substrate relative to the voltage applied at each of the test locations. The test may also be performed to determine the quality of the oxide or the quality of the furnace, or other device, in which the oxide was formed.

A lift mechanism, including a guide rod 226, a bellows 228 and a lift actuator 230 mounted to the bottom of the chamber section 206, raises the substrate support member 202 to the target 204 for the PVD chamber 200 to perform the process and lowers the substrate support member 202 to exchange substrates. When the substrate support member 202 is raised for processing a production substrate, the clamp ring 234 contacts the substrate around the periphery of the substrate to form a barrier between the process environment 203 and the rest of the chamber 200; so when the test substrate with the mask is placed on the substrate support member 202 and raised for processing, the clamp ring 234 contacts the periphery of the mask, instead of the test substrate, to form the barrier with the rest of the chamber 200. In an additional embodiment, the mask may be slightly smaller than the substrate and the clamp ring, so the clamp ring seats on the substrate normally. Additionally, a shield 232, disposed within the chamber section 206, surrounds the substrate support member 202 and the substrate during processing in order to prevent the target material from depositing on the edge of the substrate and on other surfaces inside the chamber section 206.

Situated above the chamber section 206 and sealed from the processing region of the chamber 200 is a magnetron section, which includes a cooling chamber 216 and magnetron 208. A cooling fluid flows into the cooling chamber 216 through inlet 218 and out of the cooling chamber 216 through outlet 220, at a rate of about three gallons per minute. The magnetron 208 has a set of magnets 210 arranged within the magnetron 208 so that they create magnetic field lines which are rotated across the sputtering surface of the target 204. Electrons are captured or trapped along these lines, where they collide with gas atoms, creating ions at the surface of the target 204. To create this effect about the circumference of the target 204, the magnetron 208 is rotated during processing. A motor assembly 212 for rotating the magnetron 208 is mounted to the top 217 of the cooling chamber 216.

A negative dc bias voltage of about 200 V or more is typically applied to the target 204, and a ground is applied to an anode, the substrate support member 202, and the chamber surfaces. The combined action of the dc bias and the rotating magnetron 208 generate an ionized plasma discharge in a process gas, such as argon, between the target 204 and the substrate or the test substrate. The positively charged ions are attracted to the target 204 and strike the target 204 with sufficient energy to dislodge atoms of the target material, which sputters onto the substrate. The freed electrons from the process gas and secondary electrons from the target 204 undergo sufficient collisions to maintain the plasma discharge in the process gas because the magnetic fields of the magnetron 208 confine the electrons to a region close to the target 204 in order to maximize the opportunity for ionizing collisions near the target 204 before the electrons are lost to a grounded surface. In this manner, the magnetron 208 also "shapes" the plasma typically into a circular plasma ring in a containment field near the target.

The pump section 222 typically includes a cryopump, or other high vacuum pump, for pumping the chamber section 206 to a very high vacuum, so the chamber section 206 may process a substrate (not shown). A gate valve 205 is disposed between the chamber section 206 and the cryopump 222 to provide access therebetween so the cryopump 222 can reduce the pressure in the chamber section 206 and to provide isolation therebetween so the chamber section 206 may be vented.

EXAMPLE 1

Figure 4A:
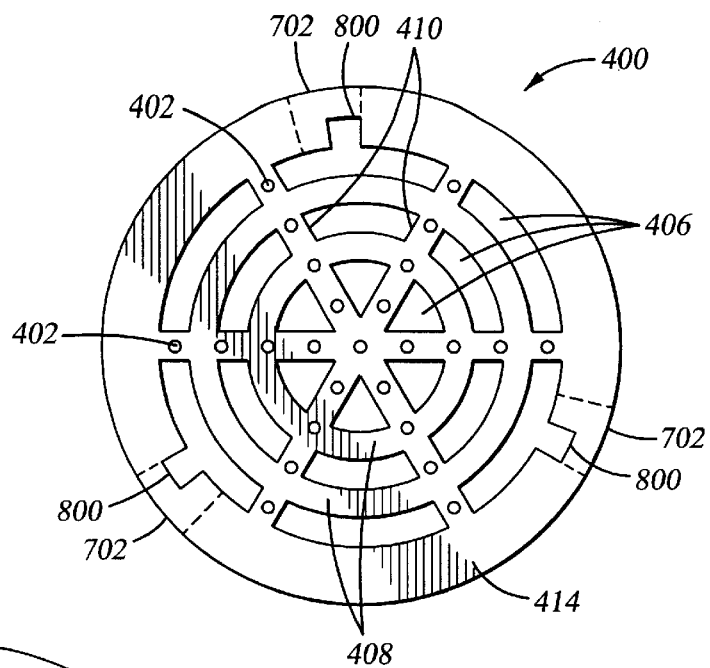
FIG. 4a is a top view of an embodiment of a mask.
Figure 4B:
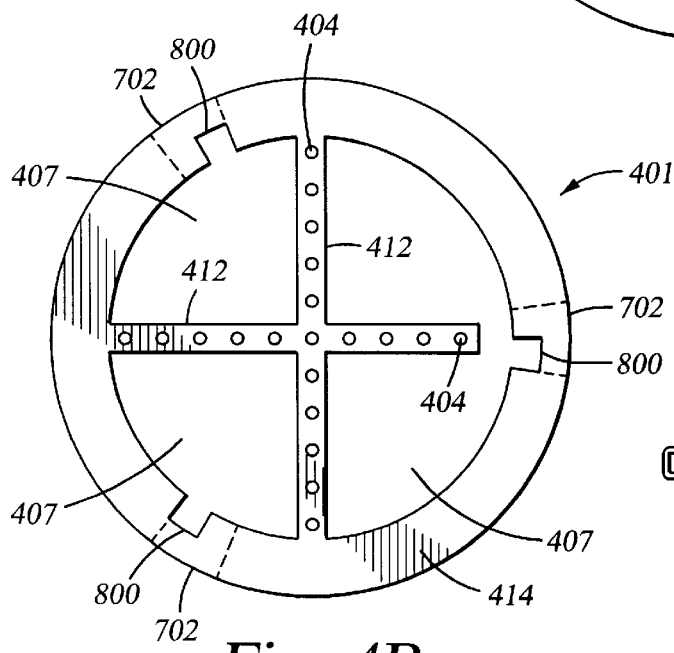
FIG. 4b is a top view of another embodiment of a mask.

FIGS. 4a and 4b show two exemplary masks 400, 401 that may be placed on the test substrate to create the test locations for the capacitance/voltage test. The mask 900 may be a single sheet of material, typically non-magnetic, such as aluminum, stainless steel, plastic, quartz, kapton tape or other suitable material. Although the invention is described with reference to the masks 400, 401 and other embodiments described below, it is understood that the invention is not limited to the embodiments shown, but may encompass other mask designs as well. To adequately test the quality of the entire target 204, a sufficient number of test locations must be spaced across the surface of the substrate. The mask 400 provides test location holes 402 arranged in six radial lines 410 from the center of the mask 400, and the mask 401 provides test location holes 404 arranged in four radial lines, or masking sections, 412 from the center of the mask 401, for permitting deposition of the target material at corresponding test locations on the test substrate. It is understood that the invention contemplates any number of test location holes 402, 404 arranged in any configuration on the mask 400, 401.

It is preferred that the mask 400, 401 be as light as possible, so the test substrate with the attached mask 400, 401 may be properly transferred through the processing system 100. Therefore, cutouts 406, 407 limit the weight of the mask 400, 401. The ribs, or masking sections, 408 between the cutouts 406 provide structural stability to the mask 400. The cutouts 406, 407 will permit the target material to be deposited on the test substrate at corresponding locations, but this material will not affect the test locations, since the test locations will be isolated from any other deposits on the test substrate.

Figure 5:
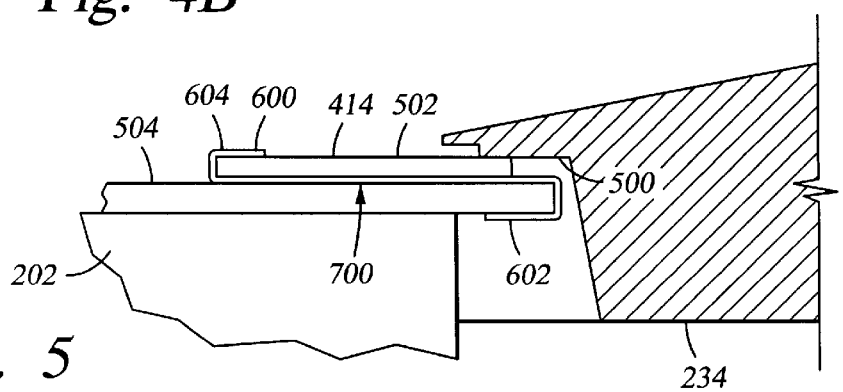
FIG. 5 is a cut-away side sectional view of a mask in a processing position.

An outer mask ring 414 of the masks 400, 401 provide structural stability to the masks 400, 401 as well as a seating surface for the clamp ring 234. As shown in FIG. 5, the clamp ring 234 has an inner lip 500 that seats on the top surface 502 of the mask ring 414 when the substrate support 202 raises the test substrate 504 to the processing position, thus forming the barrier to prevent the plasma and the sputtered material from escaping between the clamp ring 234 and the mask ring 414.

Figure 6:
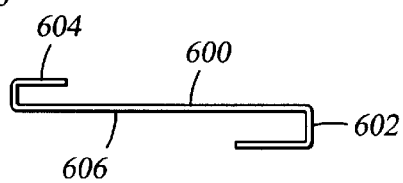
FIG. 6 is a side view of a clip.

A clip 600 attaches the mask 400, 401 to the test substrate 504. The clip 600 is shown separately in FIG. 6 for clarity. The clip 600 has an S-shape with a substrate end 602 that wraps around the edge of the test substrate 504 (FIGS. 5 and 7) and a mask end 604 that wraps around the inside edge of the mask ring 414. A thinned portion 702 (FIGS. 4, 7 and 8) of the mask ring 414 forms a small gap 700 between the mask ring 414 and the test substrate 504 for the middle 606 of the clip 600 to extend from the edge of the test substrate 504 to the inner edge of the mask ring 414 without interfering with the seat between the clamp ring 234 and the top surface 502 of the mask ring 414. In this manner, a small gap will remain between the mask 400, 401 and the test substrate 504 through which some of the plasma or the sputtered material may pass, but it has been found to be an insignificant amount.

Figure 7A:
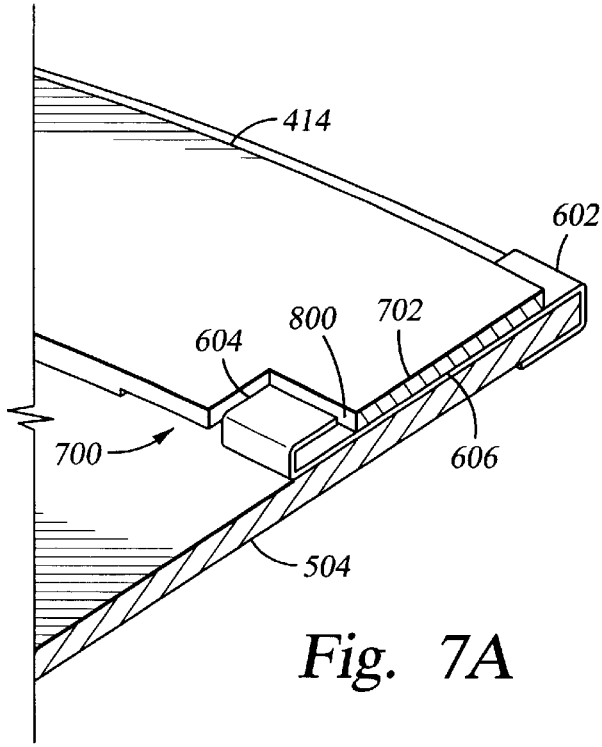
FIG. 7a is a cut-away perspective view of a mask, substrate and clip in a first position.
Figure 8A:
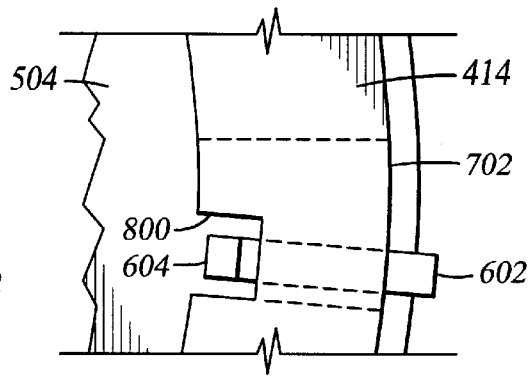
FIGS. 8a, 8b and 8c are cut-away top views of a mask, substrate and clip depicting a method to attach the mask to the substrate.
Figure 8B:
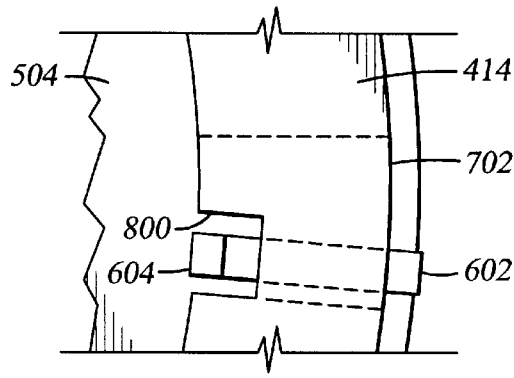
Figure 7B:
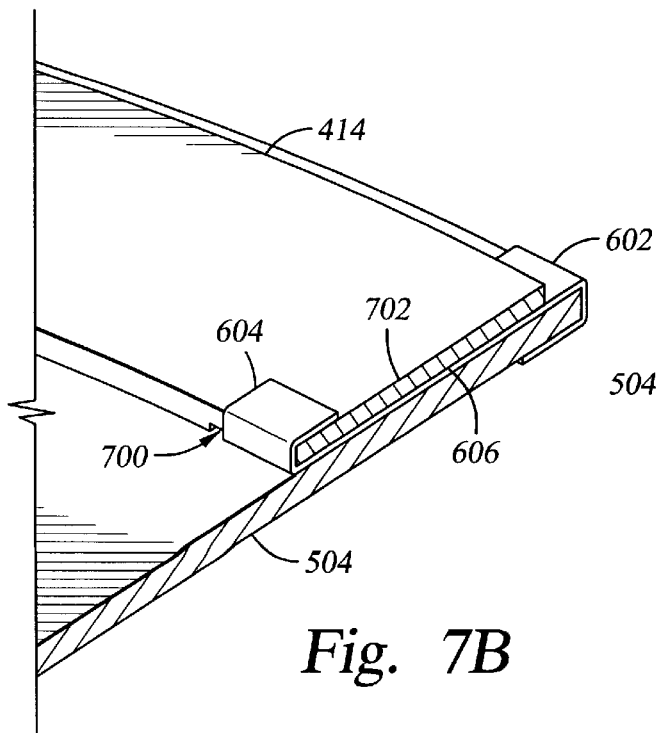
FIG. 7b is a cut-away perspective view of a mask, substrate and clip in a second position.
Figure 8C:
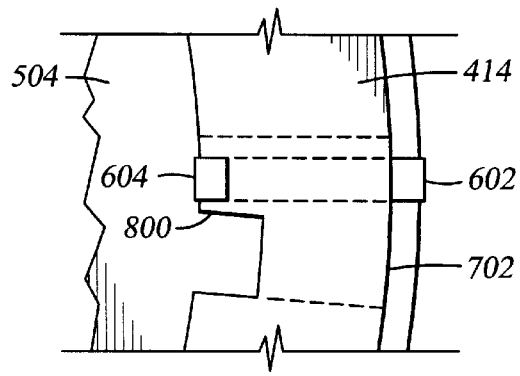

A cutout 800 in the inner edge of the mask ring 414 at the thinned portion 702 provides a way to attach the clip 600 to the mask 400, 401 and the test substrate 504. As shown in FIG. 8a, a mask 400, 401 is placed on the test substrate 504 with a clip 600 therebetween in the small gaps 700 such that the mask end 604 of the clips 600 is disposed in the cutouts 800, the substrate end 602 extends outward beyond the edge of the substrate 504 and the middle 606 of the clips 600 is disposed within the small gaps 700. The clips 600 are pushed radially inward, such that the substrate end 602 of the clips 600 slides onto and clamps to the edge of the test substrate 504 and the mask end 604 extends outside the cutouts 800, as shown in FIGS. 7a and 8b. The clips 600 are pushed tangentially, such that the mask end 604 slides onto and clamps to the inner edge of the mask ring 414 within the thinned portion 702 and the substrate end 602 is still clamped to the edge of the test substrate 504, as shown in FIGS. 7b and 8c. With the mask 400, 401 clamped to the test substrate 504 in this manner at any number of appropriate locations, such as the three locations shown in FIGS. 4a and 4b, the mask 400, 401 is held in contact with the test substrate 504, so the target material will deposit on the test substrate 504 at the desired locations represented by the holes 402, 404.

EXAMPLE 2

Figure 9:
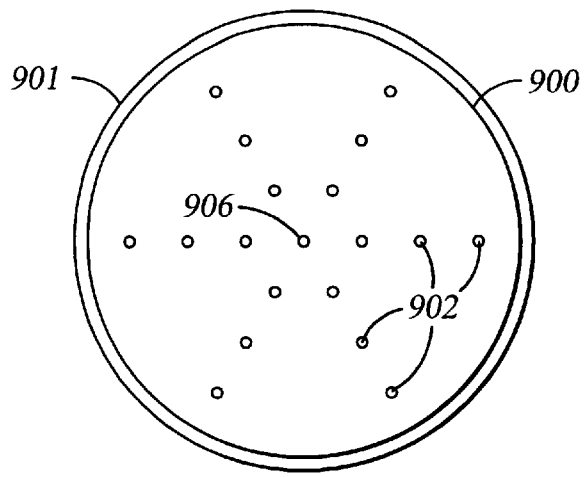
FIG. 9 is a top view of another embodiment of a mask.
Figure 10:
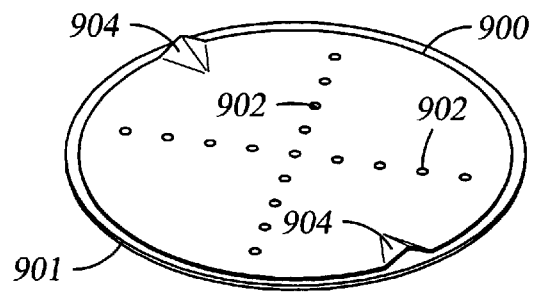
FIG. 10 is a top perspective view of an embodiment of a mask.
Figure 11A:
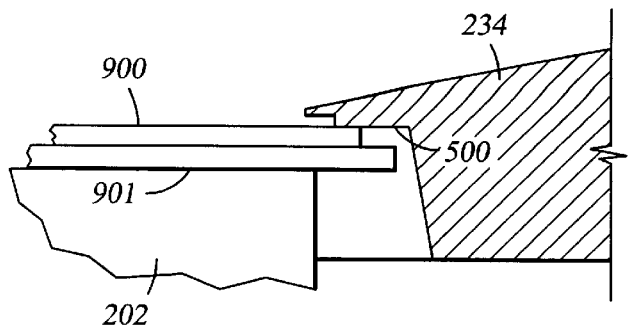
FIGS. 11a, 11b, 11c, 11d and 11e are cutaway side sectional views showing alternative embodiments for masks.
Figure 11B:
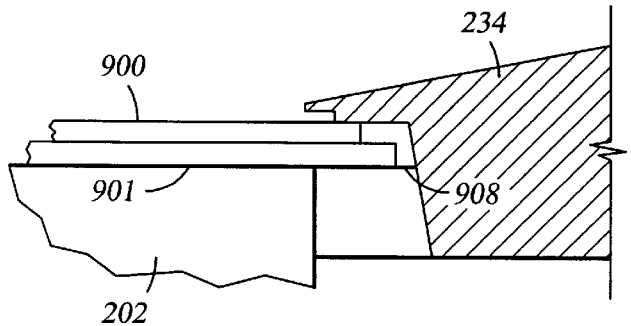
Figure 11C:
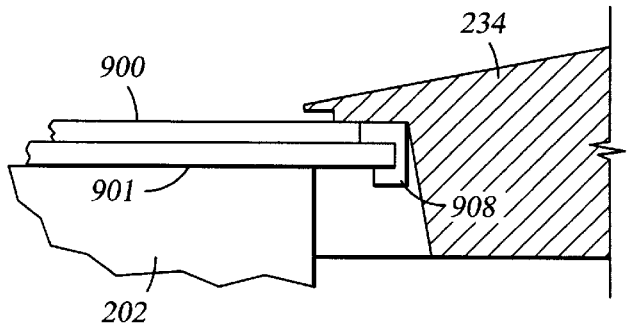
Figure 11D:
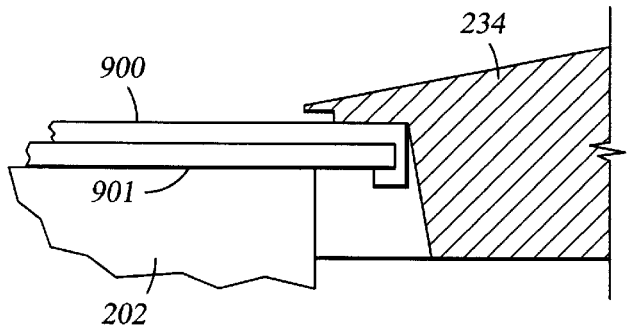
Figure 11E:
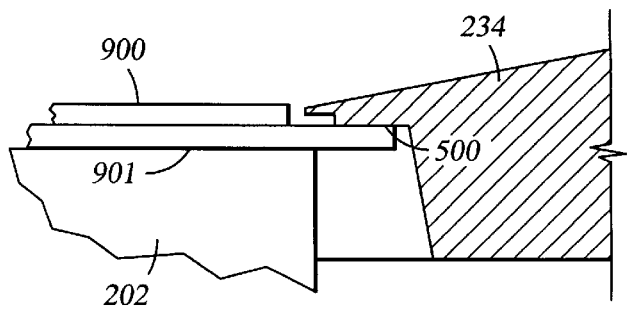

FIG. 9 shows an alternative embodiment for a mask 900 that may be placed on the test substrate to create the test locations for the capacitance/voltage test. The mask 900 may be a single sheet of material, such as aluminum, stainless steel, plastic, quartz, kapton tape or other suitable nonmagnetic material, that covers substantially all of the surface of the substrate that would otherwise be exposed to material deposition. The sheet is shown as a disk with a diameter slightly less than the substrate diameter and slightly greater than the inner diameter of the clamp ring 234, so that the clamp ring 234 seats on the mask (FIG. 11a), but in an alternative embodiment, the mask may have a diameter slightly less than the inner diameter of the clamp ring 234, so that the clamp ring 234 seats on the substrate (FIG. 11e). The mask 900 provides test location holes 902 arranged in eight radial lines from the center of the mask 900 for permitting deposition of the target material at corresponding test locations on the test substrate 901. It is understood, however, that the invention contemplates any number of test location holes 902 arranged in any configuration on the mask 900. The mask 900 may have cutout areas for weight considerations and may be any appropriate shape other than the circular shape shown. Additionally, the mask 900 may have lifted edge portions 904, as shown in FIG. 10, for ease of removal of the mask 900 from the test substrate 901 after deposition of the target material at the test locations.

The mask 900 may be placed on the test substrate 901 without attaching the mask 900 to the test substrate 901 in any way, so that the mask 900 seats on the test substrate 901 is held in place on the test substrate 901 by only surface tension. Alternatively, the mask may be attached in any suitable manner, including but not limited to the alternative attachment methods described below, provided the test deposits of the target material are not damaged by the mask 900 or the attachment mechanism.

EXAMPLE 3

Figure 1A:
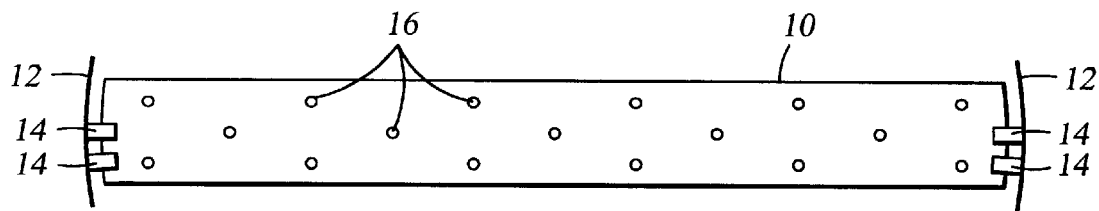
FIG. 1a is a top plan view of a substrate with a mask clamped to the substrate.
Figure 1B:
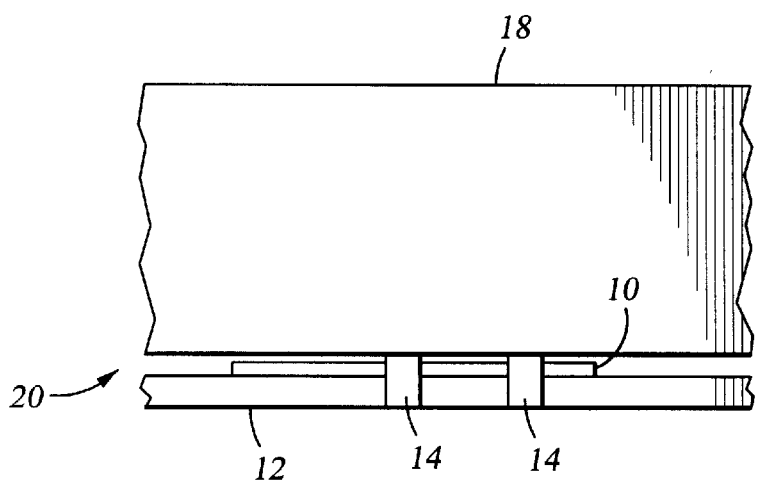
FIG. 1b is a side view of a mask clamped to a substrate and with a clamp ring seated on the mask.
Figure 13:
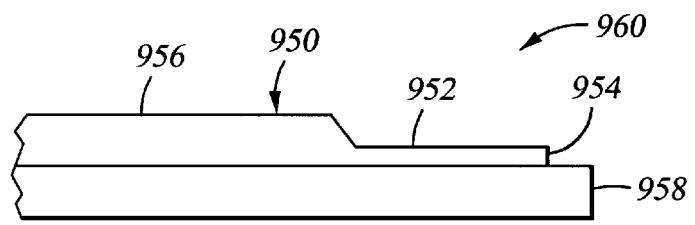
FIG. 13 is a cutaway side sectional view of an embodiment of a mask.

FIG. 13 shows a cutaway side sectional view of an alternative embodiment for a mask 950 that may be placed on the test substrate 958 to create the test locations for the capacitance/voltage test. The mask 950 has a thinner outer section 952 near the outer edge 954 of the mask 950 to provide proper clearance tolerance for the test substrate/mask assembly 960 to be inserted into and removed from a cassette for delivering the assembly 960 to the processing system. The thin outer section 952 provides the surface on which the clamp ring 234 rests and may provide the attachment points for clips to attach the mask 950 to the test substrate 958. The mask 950 also has a thicker inner section 956 to provide the locations for the test holes (not shown) for depositing the test material on the test substrate 958 and also to provide the structural strength for the full face mask 950 to withstand damage and bending and to ensure proper contact between the mask 950 and the test substrate 958, so the test locations of the target material will be properly formed.

Inner and outer sections having different thicknesses may be used with any type of full face mask, including, but not limited to, the full face masks 400, 401 having cutout sections 406, 407 as in the embodiments shown in FIG. 4 or the full face mask 900 having no cutout sections as shown in FIG. 9. For those full face masks 400, 401 having an outer ring 414, as shown in FIG. 4, the outer ring 414 is ideally suited to being the thin outer section 952.

Outer and inner sections of differing thicknesses may cause the full face mask 950 to warp or bow. Such bowing may prevent the full face mask 950 from seating completely flat on the test substrate 958 across its entire surface. To prevent this bowing, the full face mask 950 may be annealed, or heat treated, by pressing the full face mask 950 between two flat surfaces and baking the full face mask 950 at a sufficient temperature for a sufficient time to eliminate the bowing.

Alternative Attachment Methods

The following attachment methods may be incorporated with any of the above described masks. In one embodiment, the mask 900 may be glued to the test substrate 901 by placing a suitable adhesive at the center hole 906 or any other suitable location where the adhesive may properly bond to both the mask 900 and the test substrate 901. In this embodiment, or in the embodiment above wherein the mask 900 is not attached to the test substrate 901, the inner lip 500 of the clamp ring 234 contacts the mask 900 near the edge of the mask 900 (FIG. 11a) or seats on the substrate 901 (FIG. 11e) when the chuck 202 raises the test substrate 901 to the processing position. In this manner, no gaps remain between the clamp ring 234 and the test substrate 901 for the plasma or the sputtered material to escape from the process environment 203. In an alternative to this embodiment, the mask 900 may have score lines along which the mask 900 may be easily torn for removal, so the adhesive bond does not have to be broken.

Figure 12A:
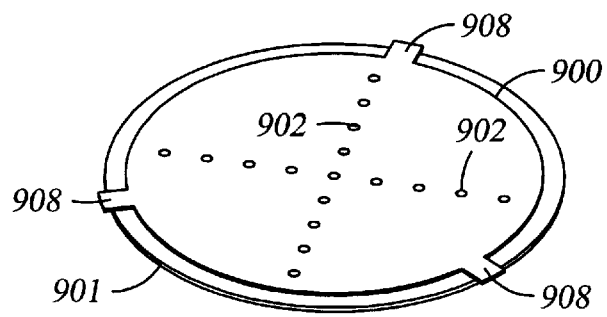
FIGS. 12a and 12b are top perspective views showing alternative embodiments for masks.

In another embodiment, the mask 900 may have a number of extensions 908, as shown in FIG. 12a, that extend beyond the edges of the mask 900 and the test substrate 901 to form a bend around the edge of the test substrate 901. In a first alternative for this embodiment, as shown in FIG. 11b, the extensions 908 do not extend under the test substrate 901, so the extensions 908 effectively only fix the mask 900 in the horizontal plane, so that the mask 900 may be merely placed onto the test substrate 901 or glued to the test substrate 901 as described above. In a second alternative for this embodiment, as shown in FIG. 11c, the extensions 908 are folded under the edge of the test substrate 901, so the extensions 908 hold the mask 900 onto the test substrate 901 vertically as well as horizontally. In either alternative for this embodiment, the clamp ring 234 seats on the edge of the mask 900, rather than just on the extensions 908, so the presence of the extensions 908 do not cause a gap between the clamp ring 234 and the test substrate 901.

Figure 12B:
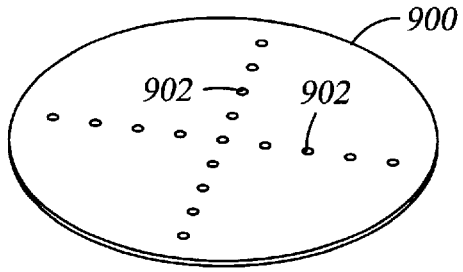

In yet another embodiment, as shown in FIG. 12b, the mask 900 may have a diameter that extends beyond the edge of the test substrate (FIG. 11d), so the entire periphery of the mask 900 is folded over the edge of the test substrate. Thereby, the top of the test substrate 901 is entirely covered, and no gaps occur between the clamp ring 234 and the test substrate 901.

Capacitance/Voltage Test

When a target is initially installed in a process chamber, to determine the quality of the target material, a test substrate with a mask as described above is introduced into the processing system in any appropriate manner including the same manner that other substrates are entered for actual processing therein. In other words, a pod containing the test substrate may be placed on the pod loaders, and the test substrate transferred through the processing system to the process chamber by the substrate handlers. The added height of the test substrate due to the presence of the mask may require that the clearance within the pod be greater for the test substrate than for other substrates. For example, one level of the substrate supports within the pod may be removed, so the test substrate may be placed on the next lower substrate supports and thereby have twice as much vertical space as other substrates.

The test substrate is processed in the process chamber in substantially the same manner that the other substrates are to be processed. After the test substrate is transferred back out of the processing system, the mask is removed and probes are attached to the test locations on the top surface of the test substrate and to corresponding locations on the bottom surface thereof. The capacitance is measured as the voltage across the probes is varied. If one or more of the test locations shows a capacitance lower than is acceptable, then the target is determined to be of poor quality, another new target is put in its place and the capacitance/voltage test is performed on the new target. Otherwise, if the measured capacitance at each of the test locations is acceptable, then the processing system may proceed toward processing substrates in the process chamber.

The System

An exemplary system incorporating the present invention will now be described. Referring back to FIG. 2, the system 100 is an example of the Endura™ family of systems from Applied Materials, Inc. Although the present invention is described with reference to this system 100, it is understood that the present invention is not limited to this particular type of system. Rather, other types of processing systems are contemplated by the present invention, too. The vacuum processing system 100 includes a transfer chamber 102 and a buffer chamber 106 typically mounted on a platform (not shown) and generally forming a system monolith 101. The transfer chamber 102 has a number of process chambers 104 mounted at facets 105 for performing the primary processes of the system 100 on the substrates. The system monolith 101 has two load lock chambers 116 mounted at facets 117 for transitioning the substrates into the vacuum environment of the system 100. An optional mini-environment 124 attaches to the load lock chambers 116 for transferring the substrates into the load lock chambers 116. The transfer chamber 102, the buffer chamber 106 and the mini-environment 124 each have at least one substrate handler 114, 112, 128, or robot, for transferring substrates therethrough. Each of the process chambers 104 may be tested with a test substrate having a mask as described above.

The process chambers 104 perform the primary process on the substrates in the vacuum processing system 100. Process chambers 104 may be any type of process chamber, such as a rapid thermal processing chamber for heat treating or curing a substrate, a physical vapor deposition chamber, a chemical vapor deposition chamber, an etch chamber, etc. The process chambers 104 may be supported by the transfer chamber 102 or may be supported on their own platforms depending on the configuration of the individual process chambers 104. Slit valves (not shown) in the facets 105 provide access and isolation between the transfer chamber 102 and the process chambers 104. Correspondingly, the process chambers 104 have openings (not shown) on their surfaces that align with the slit valves.

A pre-clean chamber 108 and a cool-down chamber 110 are disposed between the transfer chamber 102 and the buffer chamber 106. Alternatively, both chambers 108, 110 may be pass-through/cool-down chambers. The pre-clean chamber 108 cleans the substrates before they enter the transfer chamber 102, and the cool-down chamber 110 cools the substrates after they have been processed in the process chambers 104. The pre-clean chamber 108 and the cool-down chamber 110 may also transition the substrates between the vacuum levels of the transfer chamber 102 and the buffer chamber 106. The buffer chamber 106 has two expansion chambers 118 for performing additional processes on the substrates. Alternatively, one or both of the chambers 118 may be pre-clean chambers. The buffer chamber 106 further has an additional chamber 120 for additional pre-processing or post-processing of the substrates, such as degassing or cooling, if necessary. Yet another chamber 122, such as a substrate aligner chamber, is typically attached to the buffer chamber 106.

The load lock chambers 116 transition the substrates between the ambient environment pressure to the buffer chamber vacuum pressure. Openings (not shown) in facets 117 provide access and valves provide isolation between the load lock chambers 116 and the buffer chamber 106. Correspondingly, the load lock chambers 116 have openings on their surfaces that align with the openings in facets 117. The load lock chambers 116 and the mini-environment 124 have corresponding openings (not shown) providing access therebetween, while doors (not shown) for the openings provide isolation.

The optional mini-environment 124 has four pod loaders 126 attached on its front side. Openings (not shown) with corresponding doors 125 provide access and isolation between the mini-environment 124 and the pod loaders 126. The pod loaders 126 are mounted on the side of the mini-environment 124 and are essentially shelves for supporting the pods (not shown) used to transport the substrates to and from the vacuum processing system 100.

The substrate handler 114 is disposed within the transfer chamber 102 for transferring a substrate 115 between the pre-clean chamber 108, the cool-down chamber 110 and the process chambers 104. A similar substrate handler 112 is disposed within the buffer chamber 106 for transferring a substrate 113 between the load lock chambers 116, the expansion chambers 118, the cool-down chamber 120, the substrate aligner chamber 122, the pre-clean chamber 108 and the cool-down chamber 110. Likewise, one or more substrate handlers 128 are disposed within the mini-environment 124 for transferring the substrates between the pod loaders 126 and the load lock chambers 116. The substrate handler 128 is typically mounted on a track so the substrate handler 128 can move back and forth in the mini-environment 124.

In the exemplary processing system 100, the test substrate having a mask enters the processing system 100 by being removed from a pod on a pod loader 126 by the substrate handler 128. The substrate handler 128 inserts the test substrate into a load lock chamber 116. After the load lock chamber 116 transitions the test substrate to the vacuum level of the buffer chamber 106, the buffer chamber substrate handler 112 transfers the test substrate to one of the chambers 108, 110. After the chamber 108, 110 transitions the test substrate to the vacuum level of the transfer chamber 102, the transfer chamber substrate handler 114 transfers the test substrate to a process chamber 104. After the process chamber 104 processes the test substrate by depositing a layer, of material onto the test substrate, the transfer chamber substrate handler 114 transfers the test substrate to one of the chambers 108, 110. After the chamber 108, 110 transitions the test substrate back to the vacuum level of the buffer chamber 106, the buffer chamber substrate handler 112 transfers the test substrate to a load lock chamber 116. After the load lock chamber 116 transitions the test substrate back to the ambient pressure level, the substrate handler 128 transfers the test substrate to a pod on a pod loader 126. Afterward, the test substrate is removed from the pod, the mask is removed from the test substrate, and the test substrate is ready for the capacitance/voltage test.

Thus, while the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope and spirit of the invention as set forth. Therefore, many modifications may be made to adapt a particular situation or material to the teachings of the invention without departing from the essential scope and spirit of the present invention. It is intended that the invention not be limited to the particular embodiment disclosed as the best mode contemplated for carrying out this invention, but that the invention will include all embodiments and equivalents falling within the scope of the appended claims.

What is claimed is:

1. A substrate mask assembly, comprising:

a substrate; and a mask ring having an outer section having a thinned outer edge extending around and covering an outer perimeter of the substrate and a central section having a thickness greater than a thickness of the thinned outer edge of the outer section;

wherein the central section comprises a strip bridging the mask ring, and the strip has a pattern therein for permitting deposition of material on the substrate.

2. The substrate mask assembly of claim 1, wherein a plurality of strips bridge the mask ring and have a pattern therein for permitting deposition of material on the substrate.

3. The substrate mask assembly of claim 1, further comprising at least one clip for releasably clamping the mask ring to the substrate.

4. The substrate mask assembly of claim 3, wherein the mask ring includes a top surface, a generally planar bottom surface, and at least one recess in the bottom surface for permitting the at least one clip to be at least partially disposed between the mask ring and the substrate.

5. The substrate mask assembly of claim 4, wherein the at least one clip and the mask ring form a generally planar upper seating surface.

6. The substrate mask assembly of claim 4, wherein the at least one clip has a first end for attaching to the substrate and a second end for attaching to the mask ring.

7. The substrate mask assembly of claim 1, wherein the sheet of material is affixed by an adhesive to the substrate.

8. The substrate mask assembly of claim 1, wherein the outer section of the mask ring extends beyond and at least partially over an edge of a substrate.

9. An assembly for masking a test substrate, comprising:

a test substrate;

a substrate support member; and a sheet of material having a top surface and a generally planar bottom surface for covering substantially all of an exposed surface of the test substrate, the sheet of material comprising:

an outer section having a thinned outer edge extending around and covering an outer perimeter of the substrate and a central section having a thickness greater than a thickness of the outer section; and a plurality of holes in the central section for permitting a conductive material to be deposited onto the surface of the substrate.

10. The assembly of claim 9, further comprising at least one clip for releasably clamping the sheet of material to the substrate.

11. The assembly of claim 9, wherein the sheet of material is affixed by an adhesive to the substrate.

12. The assembly of claim 9, wherein the outer section extends beyond and at least partially over an edge of the substrate.

* * * * *